(12) United States Patent
Köhle (10) Patent No.: US 7,328,424 B2
(45) Date of Patent: Feb. 5, 2008

(54) METHOD FOR DETERMINING A MATRIX OF TRANSMISSION CROSS COEFFICIENTS IN AN OPTICAL PROXIMITY CORRECTION OF MASK LAYOUTS

(75) Inventor: Roderick Köhle, Ottobrunn (DE)

(73) Assignee: Infineon Technologies AG, Munich (DE)

( * ) Notice: Subject to any disclaimer, the term of this patent is extended or adjusted under 35 U.S.C. 154(b) by 216 days.

(21) Appl. No.: 11/165,566

(22) Filed: Jun. 24, 2005

(65) Prior Publication Data

US 2006/0009957 A1  Jan. 12, 2006

(30) Foreign Application Priority Data

Jun. 26, 2004  (DE) .................... 10 2004 030 961

(51) Int. Cl.
*G06F 17/50* (2006.01)
*G06F 17/10* (2006.01)

(52) U.S. Cl. ............................ 716/19; 703/2; 716/21

(58) Field of Classification Search ............ 716/19–21; 703/2
See application file for complete search history.

(56) References Cited

U.S. PATENT DOCUMENTS

| | | | |
|---|---|---|---|
| 5,710,662 A * | 1/1998 | Nishida ........................ | 359/368 |
| 6,052,626 A | 4/2000 | Inui | |
| 6,223,139 B1 | 4/2001 | Wong et al. | |

FOREIGN PATENT DOCUMENTS

WO    WO-0067074    11/2000

OTHER PUBLICATIONS

Max Born et al. (1970) "Principles of Optics," Pergamon Press 4th Edition, pp. 526-532.
Nicolas Bailey Cobb (1998) "Fast Optical and Process Proximity Correction Algorithms for Integrated Circuit Manufacturing," PhD Thesis, University of California, 1998.
H. H. Hopkins (1953) "On the Diffraction Theory of Optical Images," in Proceedings of the Royal Society of London Series A, 217(1131), pp. 408-432.

* cited by examiner

*Primary Examiner*—Stacy Whitmore
(74) *Attorney, Agent, or Firm*—Patterson & Sheridan, L.L.P.

(57) ABSTRACT

The present invention relates to a method for determining a matrix of transmission cross coefficients w for an optical modeling in an optical proximity correction of mask layouts. In a first step, there is calculation of Fourier transforms of an illumination aperture, a lens aperture and a complex conjugate lens aperture, which are present in the form of image matrices with a predetermined raster. A second step involves calculating Fourier transforms for the transmission cross coefficients w from the Fourier transforms by means of a convolution theorem in order to obtain the matrix of the Fourier transforms of the transmission cross coefficients w. A further step involves inverse-transforming the Fourier transforms of the transmission cross coefficients w by means of a fast Fourier transformation in order to obtain the matrix of the transmission cross coefficients w for the optical modeling in the optical proximity correction of mass layouts.

22 Claims, 4 Drawing Sheets

FIG 3

11 — Calculation of Fourier transforms of the illumination aperture, the lens aperture and the complex conjugate lens aperture 12 — Calculation of Fourier transforms of the transmission cross coefficients by means of the formula $$W(\vec{\omega}_0, \vec{\omega}_1) = A(-\vec{\omega}_0 - \vec{\omega}_1) L(\vec{\omega}_0) L^*(-\vec{\omega}_1)$$

mit

- $W$ ⇒ Fourier transform of a transmission cross coefficient
- $A$ ⇒ Fourier transform of the illumination aperture
- $L$ ⇒ Fourier transform of the lens aperture
- $L^*$ ⇒ Fourier transform of the complex conjugate lens aperture
- $\omega_0, \omega_1$ ⇒ Displacement frequencies 13 — Inverse transformation of the Fourier transforms of the transmission cross coefficients by means of a fast Fourier transformation

METHOD FOR DETERMINING A MATRIX OF TRANSMISSION CROSS COEFFICIENTS IN AN OPTICAL PROXIMITY CORRECTION OF MASK LAYOUTS

CLAIM FOR PRIORITY

This application claims the benefit of priority to German Application No. 10 2004 030 961.2, filed Jun. 26, 2004, the contents of which are hereby incorporated by reference.

TECHNICAL FIELD OF THE INVENTION

The present invention relates to a method for determining a matrix of transmission cross coefficients for an optical modeling in an optical proximity correction of mask layouts, and to an optical proximity correction for a mask structure of a mask layout and also to a mask layout for a lithography mask with a mask structure.

BACKGROUND OF THE INVENTION

Particular patterning methods are used for fabricating large scale integrated electrical circuits with small structure dimensions. One of the most familiar methods known since the beginnings of semiconductor technology is the lithographic patterning method. In this case a radiation-sensitive resist or photoresist layer is applied to the surface of a semiconductor substrate wafer to be patterned and is exposed with the aid of electromagnetic radiation through a lithography mask. In the exposure operation, mask structures of the layout of the lithography mask are imaged onto the photoresist layer with the aid of a lens or a lens system and transferred into the photoresist layer by means of a subsequent development process. The photoresist structures fabricated in this way are subsequently used as an etching mask in the formation of the structures in the surface of the semiconductor substrate wafer in one or more etching processes.

A principal aim of the lithographic patterning method consists in a very precise transfer of a mask layout onto the surface of a semiconductor substrate wafer. However, optical errors and process errors give rise to distortions of the imaged mask layout on the semiconductor substrate wafer. Typical imaging distortions include, inter alia, a rounding of edges, a shortening of lines and nonuniform line widths. Distortions of this type, which occur especially in the case of very small mask structures having structure sizes smaller than the wavelengths of the electromagnetic radiation used, consequently reduce the achievable resolution limit of the mask structures.

In order to increase the resolution limit in the fabrication of small structures on semiconductor substrate wafers, special methods referred to as "resolution enhancement techniques" are used. One of these techniques is that of "optical proximity correction" (OPC), in which the mask structures of a lithography mask are drawn in modified fashion in such a way that undesirable imaging distortions are compensated for or minimized. In this case, a distinction is made between so-called rule-based optical proximity correction ("rule-based OPC") and so-called model-based optical proximity correction ("model-based OPC").

In rule-based proximity correction, the mask structures are classified into different classes depending on their geometry or structure size and a predetermined correction is assigned to each structure class. In this way, corrections to a mask layout of a lithography mask can indeed be performed relatively rapidly. However, one disadvantage is that corrections of this type are inaccurate particularly in the case of very small structures and, as a result, imaging distortions may possibly be compensated for only inadequately.

In contrast to this, in a model-based optical proximity correction, the corrections to a mask layout are carried out with the aid of computer simulations that use different models, generally an optical model and a resist model. The optical model is used to simulate illumination settings of the radiation source emitting the electromagnetic radiation and imaging properties of the lens system. The exposure and development properties of the photoresist layer are registered by means of the resist model. In comparison with a rule-based proximity correction, a model-based proximity correction requires a higher expenditure of time, but more precise corrections to a mask layout can be carried out. Known embodiments of a model-based optical proximity correction are disclosed for example in WO 00/67074 A1 and Nicolas Cobb, "Fast optical and process proximity correction algorithms for integrated circuit manufacturing", PhD Thesis, University of California, Berkeley, 1998.

A model-based optical proximity correction comprises the substeps of optical modeling, resist modeling and the actual correction run, in which sections of a mask layout are successively optimized iteratively to a specific target dimension in the image. In optical modeling, which is essentially based on the imaging algorithm disclosed in H. H. Hopkins "On the diffraction theory of optical images", in Proceedings of the royal society of London, Series A, Volume 217, No. 1131, pages 408-432, 1953, a four-dimensional matrix of transmission cross coefficients is calculated by multiple evaluation of an integral incorporating the product of an illumination aperture, a lens aperture and a complex conjugate lens aperture. In this case, optical properties of a lens system are reproduced by means of the lens aperture and illumination settings are reproduced by means of the illumination aperture. The matrix of transmission cross coefficients, which is used in the later correction run for different layout sections is usually additionally subjected to a singular value decomposition.

For the case of simple geometries of the illumination and lens apertures, it is possible to evaluate the integral for determining the transmission cross coefficients analytically and thus relatively rapidly. However, if the apertures are given as "bitmaps" or image matrices which enable a more complex and precise description of the underlying lens system and the illumination settings, then the evaluation takes substantially longer depending on the desired accuracy or the size of the raster of the image matrices. Consequently, an optical modeling carried out with a high accuracy requires a very high expenditure of time. This expenditure of time can only be reduced by reducing the accuracy of the modeling and thus of the later correction run.

SUMMARY OF THE INVENTION

The present invention provides an improved method for an optical modeling in an optical proximity correction, an improved optical proximity correction and a mask layout created with the aid of an optical proximity correction in the case of which a matrix of transmission cross coefficients is determined significantly more rapidly and more efficiently.

In one embodiment of the invention, there is a method for determining a matrix of transmission cross coefficients for an optical modeling in an optical proximity correction of mask layouts. In this case, a first method step involves calculating Fourier transforms of an illumination aperture, a lens aperture and a complex conjugate lens aperture, which are present in each case in the form of image matrices with a predetermined raster. A second method step involves calculating Fourier transforms for the transmission cross coefficients from the Fourier transforms of the illumination aperture, the lens aperture and the complex conjugate lens aperture by means of a convolution theorem in order to obtain the matrix of the Fourier transforms of the transmission cross coefficients. A third method step involves inverse—transforming the Fourier transforms of the transmission cross coefficients by means of a fast Fourier transformation in order to obtain the matrix of the transmission cross coefficients for the optical modeling in the optical proximity correction of mask layouts.

In one aspect according to the invention, the invention is based on the application of the convolution theorem of Fourier transformation to the above-described integral for determining the matrix of transmission cross coefficients. Compared with the direct naïve evaluation of the integral, the invention's calculation in the Fourier space proves to be significantly faster and more efficient, particularly for the case of very large image matrices of the illumination aperture, the lens aperture and the complex conjugate lens aperture. Consequently, the method according to the invention makes it possible to use image matrices with a fine raster and thus to form a precise optical model which reproduces the underlying properties of the lens system or the illumination settings precisely and realistically.

In the relevant embodiment, the transmission cross coefficient w, which are linked in accordance with the formula $$w(\vec{p}_0, \vec{p}_1) = \int\int_{\vec{x}} a(\vec{x})l(\vec{x}+\vec{p}_0)l^*(\vec{x}+\vec{p}_1)d\vec{x}$$

with the illumination aperture a, the lens aperture l and the complex conjugate lens aperture l* given corresponding displacement vectors $p_0$, $p_1$, are determined by means of the formula—resulting from the convolution theorem of Fourier transformation—

$$W(\vec{\omega}_0, \vec{\omega}_1) = A(-\vec{\omega}_0 - \vec{\omega}_1)L(\vec{\omega}_0)L^*(-\vec{\omega}_1)$$

in the Fourier space, which formula links the Fourier transforms of the transmission cross coefficients W with the Fourier transforms of the illumination aperture A, the lens aperture L and the complex conjugate lens aperture L* given corresponding displacement frequencies $\omega_0$, $\omega_1$.

One advantage of the calculation in the Fourier space becomes evident from the comparison of the two formulae. The multiple evaluation of the abovementioned integral that is carried out for a multiplicity of different displacement vectors is extremely complicated, particularly given the presence of image matrices with a fine raster, i.e. a large number of matrix elements. The calculation of the transmission cross coefficients by Fourier transformation of the illumination aperture, the lens aperture and the complex conjugate lens aperture, multiple multiplication of the Fourier transforms of the individual apertures given corresponding displacement frequencies and subsequent inverse transformation is significantly faster, by contrast.

The invention enables the effective use of image matrices with a very fine raster. Consequently, the four-dimensional matrix of the transmission cross coefficients also has a very fine raster or a large number of matrix elements. Such a fine raster of the matrix of the transmission cross coefficients is generally not required in a subsequently carried out optical simulation of sections of a mask layout in a correction run, so that the correction run is carried out with a relatively excessively high expenditure of time. This is the case particularly with layout sections that are chosen to be very small.

In order to obtain a coarsening of the raster or a decrease in the number of matrix elements in the matrix of transmission cross coefficients, in a preferred embodiment, the image matrices of the illumination aperture, the lens aperture and the complex conjugate lens aperture are subdivided in each case into submatrices with a coarser raster compared with the image matrices, and the Fourier transforms of the transmission cross coefficients are calculated by summation of all products of corresponding submatrices of the Fourier transforms of the illumination aperture, the lens aperture and the complex conjugate lens aperture.

In this case, it is preferred for the number of submatrices of each image matrix to be defined by the raster of the matrix of the transmission cross coefficients, which is used in the optical simulation in the optical proximity correction of mask layouts. If, by way of example, the raster of the matrix of the transmission coefficients is to be coarsened by the factor eight in order to use only every eighth matrix element of the matrix of the transmission cross coefficients or only every eighth transmission cross coefficient in the optical simulation, the image matrices of the illumination aperture, the lens aperture and the complex conjugate lens aperture are subdivided into eight submatrices in each case.

In another embodiment of the invention, there is an optical proximity correction for a mask structure of a mask layout, in which the matrix of the transmission cross coefficients for the optical modeling is established by means of the above-described method or a preferred embodiment of the method.

The optical proximity correction according to the invention is correspondingly distinguished by a very fast and efficient establishment of the matrix of the transmission cross coefficients for the optical modeling, as a result of which a corrected mask layout of a lithography mask can be provided more rapidly. Furthermore, the use of very precise apertures which therefore reproduce well the illumination settings and the optical properties of a lens system is made possible. The optical proximity correction becomes very precise and exact in this way.

In still another embodiment of the invention, there is a mask layout for a lithography mask with a mask structure which contains the optical proximity correction described above. A mask layout of a lithography mask corrected in this way enables undesirable imaging distortions to be compensated for very efficiently.

BRIEF DESCRIPTION OF THE DRAWINGS

The invention is explained in more detail below with reference to the figures, in which.

DETAILED DESCRIPTION OF THE INVENTION

Figure 1:
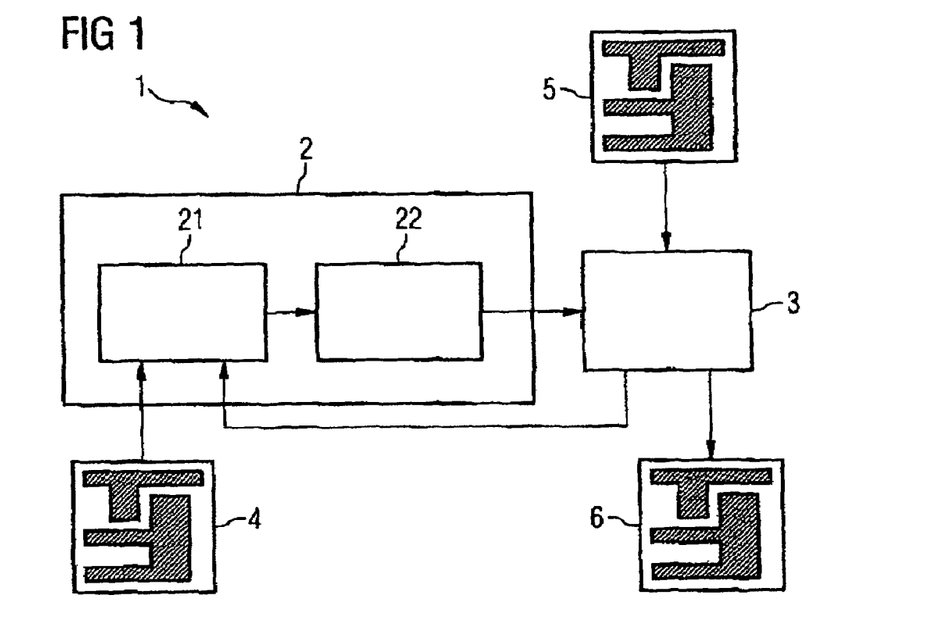
FIG. 1 shows a block diagram of a correction run of an optical proximity correction for a mask structure of a mask layout.

FIG. 1 shows a block diagram of a typical correction run 1 of a model-based optical proximity correction for a mask structure of an original mask layout 4 of a lithography mask. With the aid of the correction run 1 carried out on a computer, corrections are made to the mask layout 4, which largely compensate for distortions of the image of the mask layout 4 on a semiconductor substrate wafer that occur during a lithography process.

For this purpose, firstly a simulation of the image of the mask structure of the original mask layout 4 is carried out with the aid of a simulation unit 2. The simulation unit 2 has an optical model 21 and also a resist model 22.

The optical model 21 is used to register illumination settings of the radiation source used for a lithography process, for example the geometry of an illumination diaphragm and an illumination angle, and also imaging properties of a lens or a lens system used for imaging the mask layout 4 onto a photoresist layer of a semiconductor substrate wafer, in order to simulate the intensity distribution of the electromagnetic radiation after radiating through the mask layout 4 and the lens system. This intensity distribution is also referred to as an "aerial image".

The resist model 22 reproduces the exposure and development properties of the photoresist used. The resist model 22 is used to simulate the interaction of the electromagnetic radiation with the photoresist layer and a succeeding operation of development of the photoresist layer, in other words the image of the mask structure of the mask layout 4 on a semiconductor substrate wafer.

The simulated image of the mask structure of the mask layout 4 is subsequently compared with the mask structure of a mask layout 5 sought, by means of a correction unit 3. Given the presence of deviations between the simulated mask structure and the mask structure sought which stem from imaging distortions, the correction unit 3 makes corrections to the mask structure of the original mask layout 4. The corrected mask layout is subsequently subjected to a simulation again in the simulation unit 2. This process is repeated iteratively until the deviations between the imaged mask structure and the mask structure sought for the mask layout 5 are minimal or lie within a predetermined range. Afterward, the mask structure—corrected in this way—of a corrected mask layout 6 is output.

The above explanations concerning the correction run 1 illustrated in FIG. 1 relate only to the main constituent parts of a correction run of a model-based optical proximity correction. With regard to further details or possible supplementations of the correction run 1 illustrated, reference is made to the prior art specified above.

Before the correction run 1 illustrated in FIG. 1 is carried out, firstly the optical model 21 and the resist model 22 have to be formed. In the course of a resist modeling, for a set of selected structures a comparison is made between measurements on a photoresist layer and simulations, in order to determine the resist parameters used in a correction run. Further details on resist modeling can likewise be gathered from the prior art specified above.

In an optical modeling, a matrix of transmission cross coefficients is determined in a first work step and a singular value decomposition of said matrix is generally carried out in a second work step. The transmission cross coefficients are calculated in accordance with the formula $$w(\vec{p}_0, \vec{p}_1) = \int\int_{\vec{x}} a(\vec{x})l(\vec{x}+\vec{p}_0)l^*(\vec{x}+\vec{p}_1)d\vec{x} \quad (I)$$

which links the transmission cross coefficients w with an illumination aperture a, a lens aperture l and a complex conjugate lens aperture l* given corresponding displacement vectors $p_0$ and $p_1$. The illumination settings in an exposure operation of a lithography mask are registered by means of the illumination aperture a and the optical properties of the lens or lens system used during the lithography are registered by means of the lens aperture l or the complex conjugate lens aperture l*.

Figure 2:
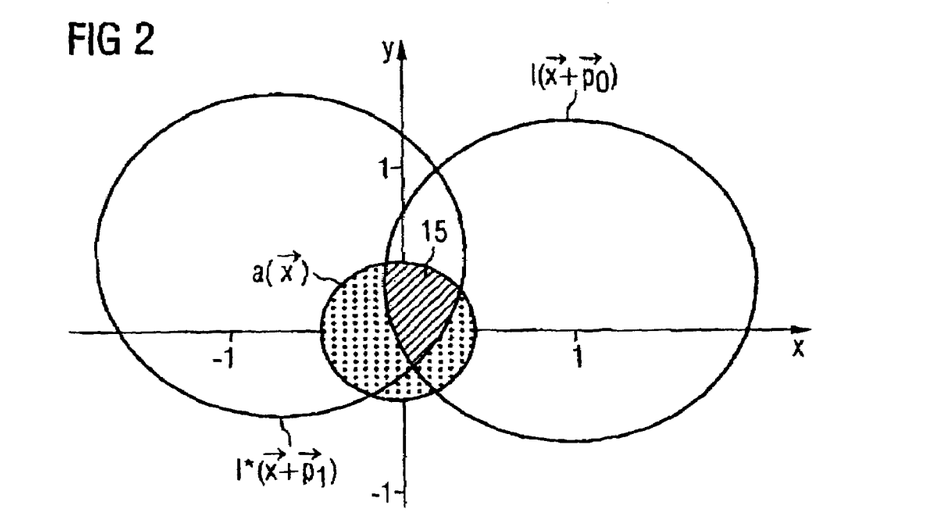
FIG. 2 shows an illumination aperture, a lens aperture and a complex conjugate lens aperture in an abstract integration region, which mutually overlap.

In order to illustrate the integral of formula I, FIG. 2 shows a schematic illustration of the illumination aperture a, the lens aperture l and the complex conjugate lens aperture l* in an abstract integration region defined by the coordinate axes x, y. The displacement vectors $p_0$, $p_1$, which are predetermined by a discrete raster of the integration region, define the center points of the lens aperture l and the complex conjugate lens aperture l*. The intersection area of the three overlapping apertures a, l and l* corresponds to the integration zone 15 to be evaluated in accordance with formula I.

In order to calculate the matrix of the transmission cross coefficients w, the integral of the formula I has to be evaluated multiply, i.e. hundreds or thousands of times, for all possible combinations of difference displacement vectors $p_0$ and $p_1$. In this case, the illumination aperture a illustrated in FIG. 2 remains at the same location, while the lens aperture l and the complex conjugate lens aperture l* are in each case displaced in a specific step size by different displacement vectors $p_0$ and $p_1$.

If the illumination aperture a, the lens aperture l and the complex conjugate lens aperture l* reproduce simple geometries, the integral of the formula I can be evaluated analytically and consequently with relatively little complexity. However, if the apertures a, l and l* are present as bitmaps or image matrices with a predetermined raster, then the direct evaluation of the integral takes significantly longer. Therefore, an evaluation in the Fourier space is proposed according to the invention.

Figure 3:
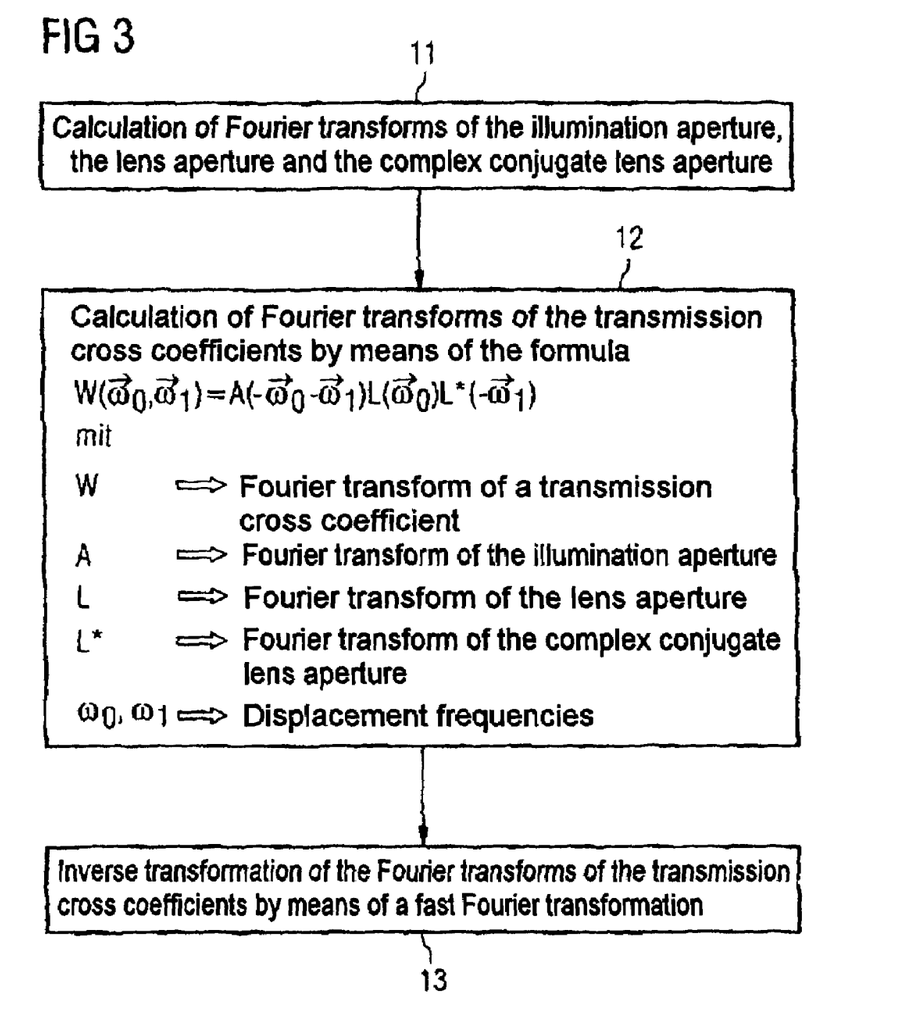
FIG. 3 shows a flow diagram of an embodiment of a method according to the invention for determining a matrix of transmission cross coefficients for an optical modeling.

For this purpose, FIG. 3 shows a flow diagram of an embodiment of a method according to the invention for determining the matrix of the transmission cross coefficients w. In this method, a first method step 11 involves calculating Fourier transforms of the illumination aperture a, the lens aperture l and the complex conjugate lens aperture l*. A subsequent method step 12 involves calculating Fourier transforms of the transmission cross coefficients by means of the formula $$W(\vec{\omega}_0, \vec{\omega}_1) = A(-\vec{\omega}_0 - \vec{\omega}_1)L(\vec{\omega}_0)L^*(-\vec{\omega}_1)$$

which results from a Fourier transformation of formula I and links the Fourier transforms of the transmission cross coefficients W with the Fourier transforms of the illumination aperture A, the lens aperture L and the complex conjugate lens aperture L* given corresponding displacement frequencies $\omega_0$, $\omega_1$. A matrix of Fourier transforms of the transmission cross coefficients W can already be established in this case. A succeeding method step 13 involves inverse-transforming the Fourier transforms of the transmission cross coefficients or the matrix thereof by means of a fast Fourier transformation in order to obtain the matrix of the transmission cross coefficients w.

The method according to the invention as illustrated in FIG. 3 affords a possibility for calculating very efficiently the matrix of the transmission cross coefficients w for the case of apertures a, 1 and 1* present as image matrices. For sufficiently large image matrices, the calculation according to the invention in the Fourier space is significantly faster compared with the direct naïve evaluation in accordance with formula I. If the individual apertures a, 1 and 1* are in each case present as n×n matrix, then the computational complexity increases with $O(n^6)$ in the case of a naïve direct evaluation, but, in contrast, with $O(n^4 \log(n))$ in the case of the evaluation according to the invention.

Figure 4A:
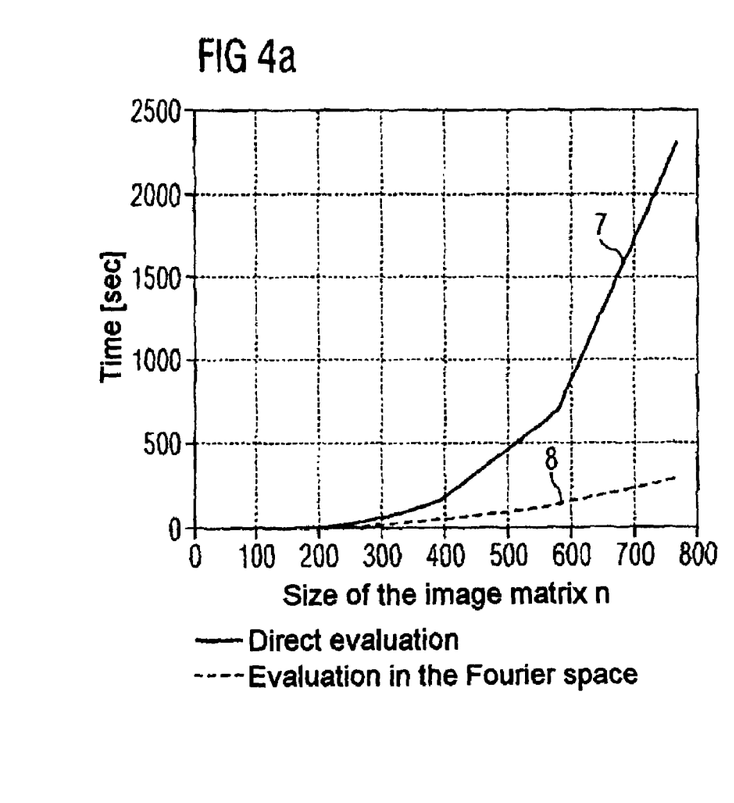
FIGS. 4a and 4b show simulated time profiles of the computation time for determining a matrix of transmission cross coefficients for one-dimensional mask structures in linear and logarithmic representation.
Figure 4B:
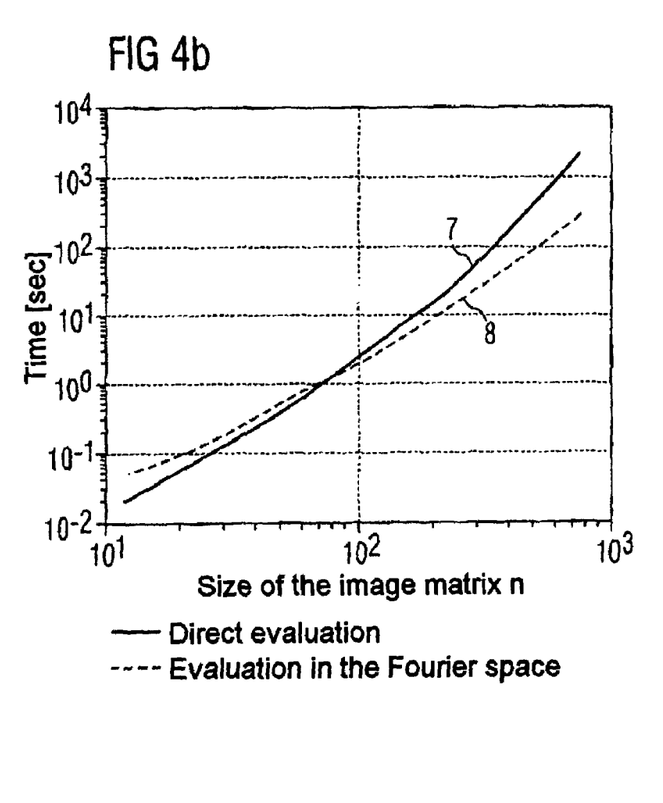

In order to illustrate the time advantage, FIGS. 4a and 4b show computer-simulated time profiles of the computation time for determining a matrix of transmission cross coefficients w for one-dimensional mask structures such as, for example, line structures as a function of the size n of the image matrices in linear and logarithmic representation. The profile of the computation time in the case of a direct evaluation in accordance with formula I is identified in this case by 7 and the profile of the computation time in the case of an evaluation in accordance with the method illustrated in FIG. 3 is identified by 8. The time advantage of the method according to the invention is clearly discernible in the case of large image matrices.

Figure 5A:
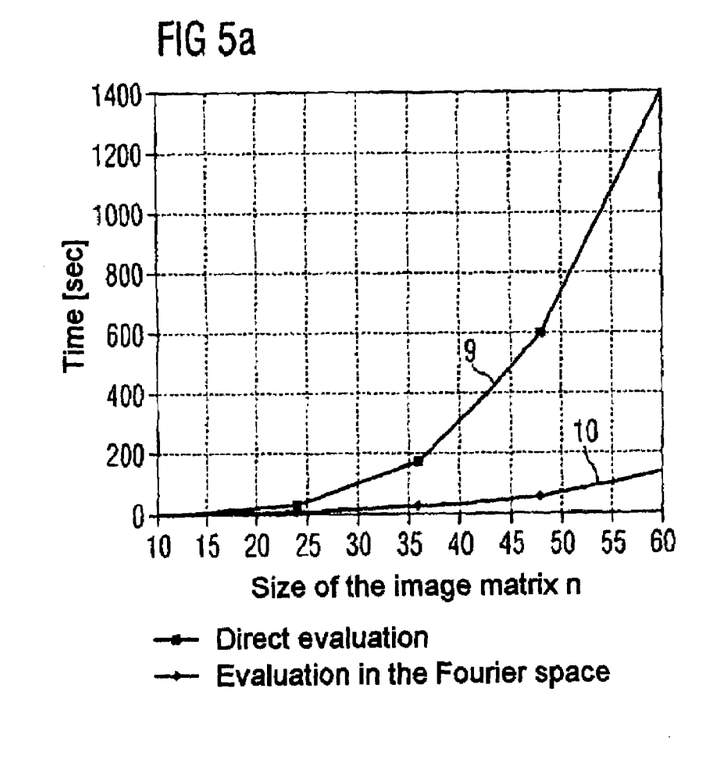
FIGS. 5a and 5b show illustrations corresponding to FIGS. 4a and 4b of simulated time profiles of the computation time for two-dimensional mask structures.
Figure 5B:
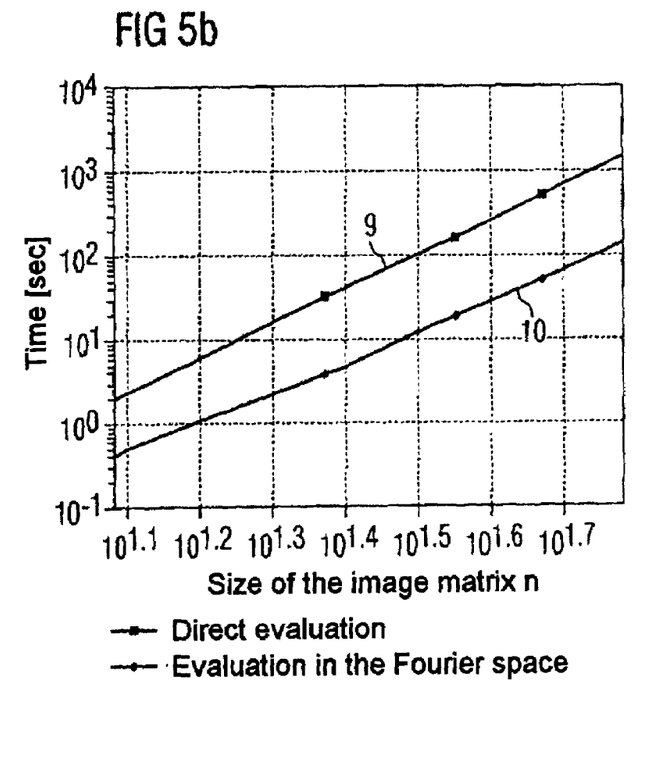

Corresponding linear and logarithmic representations of simulated time profiles of the computation time for two-dimensional mask structures are shown in FIGS. 5a and 5b. In this case, the profile of the computation time in the case of a direct naïve evaluation is identified by 9 and the profile of the computation time in the case of an evaluation according to the invention in the Fourier space is identified by 10. As can be seen from FIGS. 5a and 5b, an even greater time advantage of the evaluation according to the invention compared with direct evaluation results for two-dimensional mask structures.

Consequently, a corresponding time advantage is also afforded by an optical proximity correction according to the invention for a mask structure of a mask layout, in which the matrix of the transmission cross coefficients w for the optical modeling is established in accordance with the method illustrated in FIG. 3. Consequently, a mask layout in which such a proximity correction is carried out can be provided faster.

On account of the efficient calculation of the transmission cross coefficients w, the method according to the invention as illustrated in FIG. 3 furthermore affords the possibility of using image matrices with a fine raster or a large number of matrix elements for the illumination aperture a, the lens aperture 1 and the complex conjugate lens aperture 1*. Such image matrices make it possible to model very precisely the underlying illumination settings and the imaging properties of the lens or the lens system and to take account of, in particular, real deviations from an ideal behavior.

With regard to the lens or the lens system, it is possible, by way of example, to realistically reproduce the so-called apodization, i.e. a nonuniform transmission of electromagnetic radiation through a lens. Furthermore, the so-called "flare" effect of a lens can be taken into account in the lens aperture. This effect, which is based on the surface roughnesses of a lens, leads to additional distortions of the optical imaging.

In order to simulate particularly realistically illumination settings and optical properties of a lens or a lens system in the case of the method illustrated in FIG. 3, the illumination aperture a and/or the lens aperture 1 or the complex conjugate lens aperture 1* are preferably based on empirical measurements of illumination settings or a lens or a lens system.

As an alternative, there is the possibility of establishing models of the illumination settings or the lens or the lens system on which the illumination aperture a and/or the lens aperture 1 or the complex conjugate lens aperture 1* are based. Both statistical models and extended models in which specific value ranges or values are subjected to probabilities are defined for the matrix elements of the image matrices are appropriate in this case.

An optical proximity correction according to the invention in which the apertures a, 1 and 1* used for the optical modeling are based on empirical measurements or on models affords the possibility of a very accurate and precise correction of a mask layout. Accordingly, imaging distortions can be compensated for very efficiently with the aid of a mask layout according to the invention which contains such a proximity correction.

If the image matrices of the illumination aperture a, the lens aperture 1 and the complex conjugate lens aperture 1* have a very fine raster, the matrix of the transmission cross coefficients w that is determined with the aid of the method according to the invention as illustrated in FIG. 3 likewise has a very fine raster with a large number of matrix elements. A very fine raster of the matrix of the transmission cross coefficients w is generally not required, however, in a correction run during the optical simulation by means of an optical model, as a result of which the correction run is carried out with a relatively excessively high expenditure of time. This holds true particularly in the case of very small sections of a mask layout that are to be simulated.

In order to avoid this disadvantage, in an alternative embodiment of a method according to the invention for determining a matrix of transmission cross coefficients w, the raster of the matrix of the transmission cross coefficients w is additionally coarsened in comparison with the rasters of the image matrices of the apertures a, 1 and 1*. For this purpose, in a first method step, the image matrices of the illumination aperture a, the lens aperture 1 and the complex conjugate lens aperture 1* are in each case subdivided into submatrices having a coarser raster compared with the image matrices and, in a subsequent method step, the submatrices are subjected to a Fourier transformation. As an alternative, it is also possible firstly to carry out the Fourier transformation of the individual apertures a, 1 and 1* and subsequently to perform the subdivision of the image matrices associated with the Fourier transforms of the apertures A, L and L* into submatrices.

The Fourier transforms of the transmission cross coefficients w are subsequently calculated in each case by summation of all the products of corresponding submatrices of the apertures A, L and L* in the Fourier space. A subsequent inverse transformation of the Fourier transforms of the transmission cross coefficients W in term yields the matrix of the transmission cross coefficients w that is to be determined.

The matrix of the transmission cross coefficients w that is established in this way has a raster that is coarser by the number of submatrices of an associated image matrix. By way of example, a subdivision of the image matrices of the apertures a, l and l* into in each case eight submatrices results in a reduction of the number of matrix elements in the matrix of the transmission cross coefficients w by the factor eight. The number of submatrices of an image matrix is preferably defined by the raster of the matrix of the transmission cross coefficients w which is used in the optical simulation during an optical proximity correction.

An optical proximity correction according to the invention in which the apertures a, l and l* used for the optical modeling have a fine raster and are also based on empirical measurements or on models, and in which the method described above for determining a matrix of transmission cross coefficients w with a coarser raster is carried out consequently enables both a very accurate and precise and also a relatively fast correction of a mask layout. A mask layout according to the invention in which such a proximity correction is carried out can consequently be provided relatively fast and furthermore affords the possibility of a very efficient compensation of imaging distortions.

LIST OF REFERENCE SYMBOLS

1 Correction run
2 Simulation unit
21 Optical model
22 Resist model
3 Correction unit
4 Original mask layout
5 Mask layout sought
6 Corrected mask layout
7, 9 Profile of the computation time (direct evaluation)
8, 10 Profile of the computation time (evaluation in the Fourier space)
11, 12, 13 Method step
15 Integration zone
a Illumination aperture
l Lens aperture
l* Complex conjugate lens aperture
$p_0$, $p_1$ Displacement vector
w Transmission cross coefficient
A Fourier transform of the illumination aperture
L Fourier transform of the lens aperture
L* Fourier transform of the complex conjugate lens aperture
w Fourier transform of a transmission cross coefficient
x,y Coordinate axis
$\omega_0$, $\omega_1$ Displacement frequency

What is claimed is:

1. A method of determining a matrix of transmission cross coefficients for an optical model in an optical proximity correction of mask layouts, comprising, performing by operation of a computer processor:
   calculating Fourier transforms of an illumination aperture, a lens aperture and a complex conjugate lens aperture, which are present in a form of image matrices with a predetermined raster;
   calculating Fourier transforms of the transmission cross coefficients from the Fourier transforms of the illumination aperture, the lens aperture and the complex conjugate lens aperture by means of a convolution theorem in order to obtain a matrix of the Fourier transforms of the transmission cross coefficients; and
   inversely transforming the Fourier transforms of the transmission cross coefficients by means of a fast Fourier transformation in order to obtain the matrix of the transmission cross coefficients for the optical model in the optical proximity correction of mask layouts.

2. The method as claimed in claim 1, wherein the transmission cross coefficients, which are linked in accordance with the formula $$w(\vec{p}_0, \vec{p}_1) = \int\int_{\vec{x}} a(\vec{x}) l(\vec{x} + \vec{p}_0) l^*(\vec{x} + \vec{p}_1) d\vec{x}$$

with the illumination aperture (a), the lens aperture (l) and the complex conjugate lens aperture (l*) given corresponding displacement vectors ($\vec{p}_0$, $\vec{p}_1$), is determined by means of the formula—resulting from the convolution theorem—

$$W(\vec{\omega}_0, \vec{\omega}_1) = A(-\vec{\omega}_0 - \vec{\omega}_1) L(\vec{\omega}_0) L^*(-\vec{\omega}_1)$$

in a Fourier space, which links the Fourier transforms of the transmission cross coefficients (W) with the Fourier transforms of the illumination aperture (A), the lens aperture (L) and the complex conjugate lens aperture (L*) given corresponding displacement frequencies ($\omega_0$, $\omega_1$).

3. The method as claimed in claim 1, wherein the image matrices of the illumination aperture, the lens aperture and the complex conjugate lens aperture are subdivided into submatrices with a coarser raster compared with the image matrices, and wherein the Fourier transforms of the transmission cross coefficients are calculated by summation of all products of corresponding submatrices of the Fourier transforms of the illumination aperture, the lens aperture and the complex conjugate lens aperture.

4. The method as claimed in claim 3, wherein the number of submatrices is defined by a raster of the matrix of the transmission cross coefficients which is used in an optical simulation in the optical proximity correction of mask layouts.

5. The method as claimed in claim 1, wherein any of the illumination aperture and/or the lens aperture is based on empirical measurements of any of illumination settings, a lens and a lens system.

6. The method as claimed in claim 1, wherein any of the illumination aperture and the lens aperture is based on models of any of illumination settings, a lens and a lens system.

7. A correction run of an optical proximity correction off a mask structure of a mask layout, compromising:
   simulating an image of the mask structure of the mask layout by means of a simulation unit, the simulation unit having an optical model in which a matrix of a transmission cross coefficients for the optical model is established by:
   calculating Fourier transforms of an illumination aperture, a lens aperture and a complex conjugate lens aperture, which are present in a form of image matrices with a predetermined raster;
   calculating Fourier transforms of the transmission cross coefficients from the Fourier transforms of the illumination aperture, the lens aperture and the complex conjugate lens aperture by means of a convolution theorem to obtain a matrix of the Fourier transforms of the transmission cross coefficients; and
   inversely transforming the Fourier transforms of the transmission cross coefficients by means of a fast Fourier transformation to obtain the matrix of the transmission cross coefficients of the optical model in the optical proximity correction of mask layouts;

comparing the simulated image of the mask structure of the mask layout with a mask structure of a mask layout sought, by means of a correction unit; and making corrections to the mask structure of the mask layout in the presence of deviations between the simulated mask structure and the mask structure sought.

8. The correction run as claimed in claim 7, wherein the corrected mask layout is subsequently subjected to a simulation again by the simulation unit, wherein the process is repeated iteratively until deviations between the imaged mask structure and the mask structure sought are minimal.

9. The correction run as claimed in claim 7, wherein the corrected mask layout is subsequently subjected to a simulation again by the simulation unit, wherein the process is repeated iteratively until deviations between the imaged mask structure and the mask structure sought lie within a predetermined range.

10. The correction run as claimed in claim 7, wherein the transmission cross coefficients, which are linked in accordance with the formula $$w(\vec{p}_0, \vec{p}_1) = \int\int_{\vec{x}} a(\vec{x})l(\vec{x}+\vec{p}_0)l^*(\vec{x}+\vec{p}_1)d\vec{x}$$

with the illumination aperture (a), the lens aperture (l) and the complex conjugate lens aperture (l*) given corresponding displacement vectors ($\vec{p}_0$, $\vec{p}_1$), is determined by means of the formula—resulting from the convolution theorem—

$$W(\vec{\omega}_0, \vec{\omega}_1) = A(-\vec{\omega}_0 - \vec{\omega}_1)L(\vec{\omega}_0)L^*(-\vec{\omega}_1)$$

in a Fourier space, which links the Fourier transforms of the transmission cross coefficients (W) with the Fourier transforms of the illumination aperture (A), the lens aperture (L) and the complex conjugate lens aperture (L*) given corresponding displacement frequencies ($\omega_0$, $\omega_1$).

11. The correction run as claimed in claim 7, wherein the image matrices of the illumination aperture, the lens aperture and the complex conjugate lens aperture are subdivided into submatrices with a coarser raster compared with the image matrices, and wherein the Fourier transforms of the transmission cross coefficients are calculated by summation of all products of corresponding submatrices of the Fourier transforms of the illumination aperture, the lens aperture and the complex conjugate lens aperture.

12. The correction run as claimed in claim 11, wherein the number of submatrices is defined by a raster of the matrix of the transmission cross coefficients which is used in an optical simulation in the optical proximity correction of mask layouts.

13. The correction run as claimed in claim 7, wherein any of the illumination aperture and the lens aperture is based on empirical measurements of any of illumination settings, a lens and a lens system.

14. The correction run as claimed in claim 7, wherein any of the illumination aperture and the lens aperture is based on models of any of illumination settings, a lens and a lens system.

15. A mask layout of a lithography mask, wherein a mask structure of the mask layout is determined by an optical proximity correction, comprising:

simulating an image of the mask structure of the mask layout with the aid of a simulation unit, the simulation unit having an optical model in which a matrix of a transmission cross coefficients for the optical model is established by:

calculating Fourier transforms of an illumination aperture, a lens aperture and a complex conjugate lens aperture, which are present in a form of image matrices with a predetermined raster;

calculating Fourier transforms of the transmission cross coefficients from the Fourier transforms of the illumination aperture, the lens aperture and the complex conjugate lens aperture by means of a convolution theorem to obtain the matrix of the Fourier transforms of the transmission cross coefficients; and inversely transforming the Fourier transforms of the transmission cross coefficients by means of a fast Fourier transformation in order to obtain the matrix of the transmission cross coefficients of the optical model in the optical proximity correction of the mask layout;

comparing the simulated image of the mask structure of the mask layout with a mask structure of a mask layout sought, by means of a correction unit; and making corrections to the mask structure of the mask layout in the presence of deviations between the simulated mask structure and the mask structure sought.

16. The mask layout as claimed in claim 15, wherein the corrected mask layout is subsequently subjected to a simulation again by the simulation unit, wherein the process is repeated iteratively until deviations between the imaged mask structure and the mask structure sought are minimal.

17. The mask layout as claimed in claim 15, wherein the corrected mask layout is subsequently subjected to a simulation again by the simulation unit, wherein the process is repeated iteratively until deviations between the imaged mask structure and the mask structure sought lie within a predetermined range.

18. The mask layout as claimed in claim 8, wherein the transmission cross coefficients, which are linked in accordance with the formula $$w(\vec{p}_0, \vec{p}_1) = \int\int_{\vec{x}} a(\vec{x})l(\vec{x}+\vec{p}_0)l^*(\vec{x}+\vec{p}_1)d\vec{x}$$

with the illumination aperture (a), the lens aperture (l) and the complex conjugate lens aperture (l*) given corresponding displacement vectors ($\vec{p}_0$, $\vec{p}_1$), is determined by means of the formula—resulting from the convolution theorem $$W(\vec{\omega}_0, \vec{\omega}_1) = A(-\vec{\omega}_0 - \vec{\omega}_1)L(\vec{\omega}_0)L^*(-\vec{\omega}_1)$$

in a Fourier space, which links the Fourier transforms of the transmission cross coefficients (W) with the Fourier transforms of the illumination aperture (A), the lens aperture (L) and the complex conjugate lens aperture (L*) given corresponding displacement frequencies ($\omega_0$, $\omega_1$).

19. The mask layout as claimed in claim 8, wherein the image matrices of the illumination aperture, the lens aperture and the subdivided into complex conjugate submatrices with lens aperture are a coarser raster compared with the image matrices, and wherein in the Fourier transforms of the transmission cross coefficients are calculated by summation of all products of corresponding submatrices of the Fourier transforms of the illumination aperture, the lens aperture and the complex conjugate lens aperture.

20. The mask layout as claimed in claim 19, wherein the number of submatrices is defined by a raster of the matrix of the transmission cross coefficients which is used in an optical simulation in the optical proximity correction of mask layouts.

21. The mask layout as claimed in claim 15, wherein any of the illumination aperture and the lens aperture is based on empirical measurements of any of illumination settings, a lens and a lens system.

22. The mask layout as claimed in claim 15, wherein any of the illumination aperture and the lens aperture is based on models of any of illumination settings, a lens and a lens system.

* * * * *